United States Patent
Li

(10) Patent No.: US 9,676,627 B2
(45) Date of Patent: Jun. 13, 2017

(54) GROWTH OF SILICON AND BORON NITRIDE NANOMATERIALS ON CARBON FIBERS BY CHEMICAL VAPOR DEPOSITION

(71) Applicant: University of Dayton, Dayton, OH (US)

(72) Inventor: Lingchuan Li, Dayton, OH (US)

(73) Assignee: University of Dayton, Dayton, OH (US)

( * ) Notice: Subject to any disclaimer, the term of this patent is extended or adjusted under 35 U.S.C. 154(b) by 137 days.

(21) Appl. No.: 14/712,523

(22) Filed: May 14, 2015

(65) Prior Publication Data

US 2015/0329360 A1 Nov. 19, 2015

Related U.S. Application Data

(60) Provisional application No. 61/996,686, filed on May 14, 2014.

(51) Int. Cl.
| | | |
|---|---|---|
| *C23C 16/34* | (2006.01) | |
| *C01B 21/064* | (2006.01) | |
| *C23C 16/22* | (2006.01) | |
| *C23C 16/24* | (2006.01) | |
| *C23C 16/46* | (2006.01) | |
| *C01B 33/029* | (2006.01) | |

(52) U.S. Cl.
CPC .......... *C01B 21/064* (2013.01); *C01B 33/029* (2013.01); *C23C 16/22* (2013.01); *C23C 16/24* (2013.01); *C23C 16/46* (2013.01); *C23C 16/463* (2013.01); *C01P 2002/72* (2013.01); *C01P 2002/82* (2013.01); *C01P 2004/04* (2013.01); *C01P 2004/13* (2013.01)

(58) Field of Classification Search
CPC ........ C23C 16/34; C23C 16/342; C23C 16/46
See application file for complete search history.

(56) References Cited

U.S. PATENT DOCUMENTS

| | | | | |
|---|---|---|---|---|
| 5,643,670 A * | 7/1997 | Chung | ................... | B82Y 30/00 427/115 |
| 7,060,237 B1 * | 6/2006 | Paine, Jr. | ............. | C01B 21/064 423/277 |
| 2004/0256601 A1 * | 12/2004 | Hubacek | ................. | C09C 3/063 252/500 |
| 2008/0249221 A1 * | 10/2008 | Corkery | ................. | B82Y 30/00 524/404 |
| 2013/0029131 A1 * | 1/2013 | Chen | ...................... | B82Y 30/00 428/323 |
| 2015/0033937 A1 * | 2/2015 | Lashmore | ........... | C01B 21/0641 89/36.02 |
| 2015/0086460 A1 * | 3/2015 | Kim | .................... | C23C 18/1204 423/290 |

FOREIGN PATENT DOCUMENTS

JP 2004-217462 * 8/2004

OTHER PUBLICATIONS

Kalay, Saban, et al., "Synthesis of boron nitride nanotubes and their applications". Beilstein Journal of Nanotechnology, 2015, 6, 84-102.*
Golberg, D., et al., "Fine structure of boron nitride nanotubes produced from carbon nanotubes by a substitution reaction". Jounral of Applied Physics, vol. 86, No. 4, Aug. 15, 1999, pp. 2364-2366.*
Samanta, Suman K., et al., "Novel Nanocomposites Made of Boron Nitride Nanotubes and a Physical Gel". Langmuir, 2010, 26(14), 12230-12236.*
Zhou, Sheng-Jun, et al., "Activation of boron nitride nanotubes and their polymer composites for improving mechanical performance". Nanotechnology 23 (2012) 055708, pp. 1-8.*

* cited by examiner

*Primary Examiner* — Bret Chen
(74) *Attorney, Agent, or Firm* — Dinsmore & Shohl LLP

(57) ABSTRACT

Methods of growing boron nitride nanotubes and silicon nanowires on carbon substrates formed from carbon fibers. The methods include applying a catalyst solution to the carbon substrate and heating the catalyst coated carbon substrate in a furnace in the presence of chemical vapor deposition reactive species to form the boron nitride nanotubes and silicon nanowires. A mixture of a first vapor deposition precursor formed from boric acid and urea and a second vapor deposition precursor formed from iron nitrate, magnesium nitrate, and D-sorbitol are provided to the furnace to form boron nitride nanotubes. A silicon source including $SiH_4$ is provided to the furnace at atmospheric pressure to form silicon nanowires.

11 Claims, 5 Drawing Sheets

GROWTH OF SILICON AND BORON NITRIDE NANOMATERIALS ON CARBON FIBERS BY CHEMICAL VAPOR DEPOSITION

CROSS-REFERENCE TO RELATED APPLICATIONS

This application claims the benefit of U.S. Provisional Application No. 61/996,686, filed May 14, 2014, entitled GROWTH OF SILICON AND BORON NITRIDE NANOMATERIALS ON CARBON FIBERS BY CHEMICAL VAPOR DEPOSITION. The entire contents of said application are hereby incorporated by reference.

BACKGROUND OF THE INVENTION

The present invention is directed to methods of growing silicon nanowires and boron nitride nanotubes on carbon fibers by chemical vapor deposition or by a vapor-liquid-solid (VLS) method.

A low pressure environment ranging from a few Torrs to few a hundred Torrs is conventionally utilized for growth of silicon nanowires by VLS. However, the use of low pressure requires an employment of a vacuum pump and careful maintenance of the balance between reacting gases flowing in and product gases withdrawing from the reacting chamber. Additionally, the use of low pressure limits the amount of silicon source gases present in the reaction chamber for reaction as well as limits the flow rate of feeding the gases for replenishment, restricting growth in large scale.

Additionally, previous attempts at synthesis of boron nitride nanotubes have focused on using boron powder as the source of boron and ammonia as the source of nitrogen at temperatures ranging from 1100° C. to 1500° C. However, utilization of ammonia as a nitrogen source introduces challenges and difficulties into the synthesis process given the hazardous nature of ammonia.

Accordingly, there is still a need in the art for methods of forming silicon nanowires and/or boron nitride nanotubes on carbon substrates comprising carbon fibers using less hazardous materials and at atmospheric pressure.

SUMMARY OF THE INVENTION

Embodiments of the present invention meet those needs by providing methods of forming nanomaterials at atmospheric pressure on carbon substrates comprising carbon fibers.

According to one embodiment of the present invention, a method of growing boron nitride nanotubes is provided. The method includes applying a catalyst solution to a carbon substrate which has carbon fibers. The catalyst solution includes iron nitrate and magnesium nitrate. The method also includes providing a precursor mixture into a precursor vessel. The precursor mixture includes a mixture of a first vapor deposition precursor and a second vapor deposition precursor. The first vapor deposition precursor includes boric acid and urea and the second vapor deposition precursor includes iron nitrate, magnesium nitrate, and D-sorbitol. Further, the method includes introducing the precursor mixture and the carbon substrate into a furnace and heating the furnace to vaporize the precursor mixture in the presence of a flowing gas to facilitate growth of the boron nitride nanotubes on the carbon substrate.

According to another embodiment of the present invention, a method of growing silicon nanowires is provided. The method includes applying a catalyst solution to a carbon substrate having carbon fibers. The catalyst solution includes chloroauric acid. The method also includes introducing the carbon substrate into a tube furnace. Finally, the method includes heating the tube furnace to a temperature of about 450 to 550° C. in the presence of a silicon source comprising $SiH_4$ at atmospheric pressure to facilitate growth of the nanowire on the carbon substrate.

These, and other features and advantages of the present invention, will become apparent from the following detailed description, the accompanying drawings, and the appended claims.

BRIEF DESCRIPTION OF THE DRAWINGS

In the following drawings, like structures are indicated with like reference numerals, in which.

DETAILED DESCRIPTION OF PREFERRED EMBODIMENTS

Figure 1A:
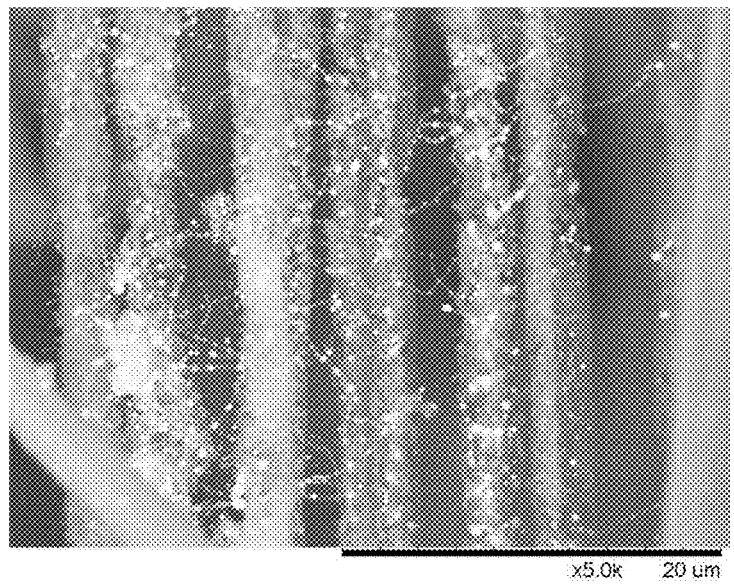
FIG. 1A is a scanning electron microscope image of boron nitride nanotubes grown on carbon fibers.

Embodiments of the invention provide a significant improvement over prior methods of growing boron nitride nanotubes and silicon nanowires.

Boron nitride nanotubes and silicon nanowires are among the important nanomaterials for various potential applications due to their unique properties. While engineering fibers such as carbon, glass and ceramic fibers have been widely utilized for structural and functional composite materials and devices, it is expected that successful growth of the nanomaterials on the engineering fibers may open opportunities of improving materials properties and/or finding new applications. However, to date, the growth on the nanomaterials on the engineering fibers has been limited in spite of the fact that the growth of the nanomaterials on other substrates has been well addressed.

Interest in boron nitride nanotubes (BNNTs) has increased following the activities on carbon nanotubes (CNTs). Not only do graphite and bulk boron nitride (BN) have similarity in structure, but also their synthesis methods have resemblances, with both consisting of arc-discharge, laser ablation, and chemical vapor deposition (CVD). While having similar extraordinary mechanical properties and thermo conductivity as carbon nanotubes, boron nitride nanotubes are also a wide band gap material (theoretically ~5.0 eV), which are insensitive to the number of walls, diameters, and chiralities, making them especially attractive for constructing insulating nanocomposites that could also have thermal, mechanical and optical performances.

Besides the electrical, thermal and mechanical properties, boron nitride nanowires also have additional unique properties in chemical stability, oxidation resistance, neutron absorbing capacity, and piezoelectric properties which apprise their use in various potential applications including sensors, biomedical materials, electronic and photonic devices, energy storage, personal/vehicle armors, and space craft shields. Hybridized or manipulated with other materials, materials properties and potential applications may be further expanded. For example, boron nitride nanotubes may encapsulate conducting and magnetic materials to bring additional ferromagnetic properties that may be used in optomagnetic-based devices and biomedical therapy.

Carbon fibers are widely used in industry for various applications, ranging from sensors to structural composites. Carbon nanotubes have been grown on carbon fibers by chemical vapor depositions, typically for constructing hybrid polymeric composites that may have improved interlaminar shear strength, fracture toughness, thermal and electrical conductivities. Based on the benefits of growing carbon nanotubes on carbon fibers, it is believed that successful growth of boron nitride nanotubes on carbon fibers may also provide significant benefits. However, growth of boron nitride nanotubes on carbon fibers has not been widely explored.

Bulk boron nitride coating has been applied on carbon fibers using boric acid and urea as the precursors. The bulk boron nitride coating brings about a significant increase of oxidation resistance of the carbon fibers. Boric acid and urea have been commercially utilized for synthesis of bulk boron nitride powder, but boric acid and urea have been less commonly seen for synthesis of boron nitride nanotubes. Boric acid has the advantage of cost and availability over boron powder. Additionally, the use of boric acid and urea avoids employing hazardous ammonia and allows the use of safe and considerably less expensive nitrogen gas.

In accordance with this disclosure, it has been found that long horn-shaped boron nitride nanotubes that have multiple encapsulated iron nanoparticles with separation distances varied in a unique manner along their length may be grown on carbon fibers by thermal chemical vapor deposition without bulk boron or ammonia.

In embodiments of the present disclosure, a method of growing boron nitride nanotubes is provided. The method includes providing a carbon substrate comprising carbon fibers and applying a catalyst solution comprising iron nitrate and magnesium nitrate to the carbon substrate. Additionally, the method includes providing a precursor mixture formed from a mixture of a first vapor deposition precursor comprising boric acid and urea and a second vapor deposition precursor comprising iron nitrate, magnesium nitrate, and D-sorbitol into a precursor vessel. The precursor vessel may be any vessel compatible with chemical vapor deposition processes including, for example, a crucible, a glass flask, or ceramic container. Then the precursor vessel with the precursor mixture therein is placed into a furnace along with the carbon substrate. Finally, the furnace is heated to vaporize the precursor mixture in the presence of a flowing gas to facilitate growth of boron nitride nanotubes on the carbon substrate.

In further embodiments, the catalyst solution also includes nitric acid and anhydrous ethanol. Application of the catalyst solution onto the carbon substrate includes immersion of the carbon substrate into the catalyst solution followed by air drying at ambient temperature. In embodiments the method further comprises cleaning the carbon substrate with acetone prior to applying the catalyst solution. In various further embodiments, the catalyst solution is made by combining about 5 to about 7 grams iron nitrate, about 4 to about 6 grams magnesium nitrate, and about 1 ml 70% nitric acid for each 100 ml of anhydrous ethanol. In a preferred embodiment, the catalyst solution is made by combining about 6 grams iron nitrate, about 5 grams magnesium nitrate, and about 1 ml 70% nitric acid for each 100 ml of anhydrous ethanol.

In embodiments, the first vapor deposition precursor is prepared by mixing about 0.15 to 0.25 grams boric acid and about 1.5 to 2.5 grams urea per 1 ml of distilled water. In a preferred embodiment, the first vapor deposition precursor is prepared by mixing about 0.15 to 0.25 grams boric acid and about 1.5 to 2.5 grams urea per 1 ml of distilled water. The mixture of boric acid, urea, and distilled water is then heated to about 120° C. for about 1 hour to form a dry first vapor deposition precursor. Then the dry first vapor deposition precursor is cooled to room temperature and ground into a fine powder.

In embodiments, the second vapor deposition precursor is prepared by dissolving iron nitrate, magnesium nitrate, and D-sorbitol at a weight ratio of about 6:5:1 in sufficient water for dissolution. Then the mixture of iron nitrate, magnesium nitrate, and D-sorbitol is heated to evaporate the water and form a dry second vapor deposition precursor. Further, the dry second vapor deposition precursor is heated in air at about 550° C. for about 15 minutes. Finally, the heated dry second vapor deposition precursor is cooled to room temperature and ground into a fine powder.

In embodiments, the mixture of the first vapor deposition precursor and the second vapor deposition precursor provided to the precursor vessel is at a weight ratio of 40:1 to 50:1. In a preferred embodiment, the mixture of the first vapor deposition precursor and the second vapor deposition precursor provided to the precursor vessel is at a weight ratio of about 44:1.

In embodiments, the furnace is a tube furnace which is heated to about 1300° C. at a rate of about 4° C./minute. Prior to heating, the furnace may be purged with $N_2$ to expel air. Additionally, during heating the flowing gas is provided. In embodiments the flowing gas is $N_2$ provided at a flow of 15-25 ml/minute. In a preferred embodiment the flowing gas is $N_2$ provided at a flow of about 20 ml/minute of $N_2$ in a preferred embodiment. Once the furnace is heated to 1300° C. it is held at about 1300° C. for about 30 minutes.

EXAMPLE

Carbon papers made of carbon fibers were cut into a size of approximately 50 mm by approximately 100 mm. The carbon papers were cleaned with acetone and subsequently had a catalyst solution applied. To prepare the catalyst solution, 12 g iron nitrate, 10 g Mg nitrate and 2 ml of nitric acid (70%) were added into 200 ml anhydrous ethanol. The catalyst was applied on the carbon papers by immersion into the catalyst solution followed by drying in air at ambient temperature.

Boric acid weighing 0.4 g was mixed with 4 g urea and 2 ml distilled water in a beaker. The mixture of boric acid, urea, and distilled water was then heated to 120° C. for 1 hr. Upon cooling to room temperature, the mixture was ground into a fine powder, which was assigned as Part A, or the first vapor deposition precursor.

A Part B, or the second vapor deposition precursor, was prepared by dissolving 3.6 g Fe nitrate, 3.0 g Mg nitrate, and 0.6 g D-sorbitol into water. The mixture of Fe nitrate, Mg nitrate, D-sorbitol, and water was heated over a hot plate until the water was evaporated. During the heating, burning may be noticed. The mixture was then heated in air at 550° C. for 15 min. The heated mixture was then ground into a fine powder upon cooling.

A mixed part NB powder, or vapor deposition precursor, was prepared by adding 0.1 g Part B powder into Part A. The remaining Part B powder may be kept for future use. The mixed Part NB powder was loaded into an alumina crucible, and the carbon paper was set on the crucible but not in contact with the powder. Another piece of carbon paper was also put into a second empty crucible. The two crucibles were placed into an alumina tube (70 mm ID) of a tube furnace, with the second crucible located downstream of the first one. Upon purging with $N_2$ to expel air, the furnace was heated to 1300° C. at a rate of 4° C./min under flow of 20 ml/min $N_2$. The furnace was kept at 1300° C. for 30 minutes under flow of the 20 ml/min $N_2$. Subsequently, the furnace was cooled down for unloading.

A scanning electron microscope (SEM) Titachi TM-1000 was used to characterize the samples. Boron nitride nanotubes were observed formed on the carbon papers located at both crucibles. FIGS. 1a and b show the scanning electron microscope (SEM) images of the boron nitride nanotubes at 5,000× magnification and 10,000× magnifications respectively. It is noted that instead of having one or two catalyst particles in each boron nitride nanotube, there were essentially several encapsulated. For some of the boron nitride nanotubes, the separation distance between two neighboring particles decreased along length of the nanotubes in the direction from their roots to tips. The diameter of the boron nitride nanotubes also gradually decreases from roots to tips. Additionally, the size of the catalyst particles encapsulated also generally decrease from root to tips of the boron nitride nanotubes with the exception that the particles located at the tips in some cases are larger in diameter than the particles located in middle part of the boron nitride nanotube.

The crucible that original contained the mixture of the first and second vapor deposition precursors (Part A/Part B powder mixture), after heating of the furnace, contains a white solid material. The remaining white solid material is believed to be amorphous boron nitride.

Figure 2A:
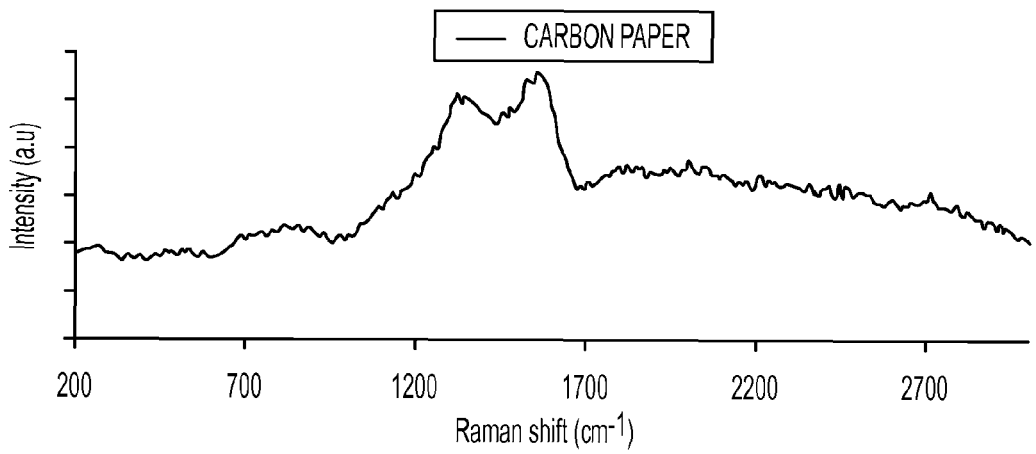
FIG. 2A is a Raman spectra for the carbon substrate comprising carbon fiber.
Figure 2B:
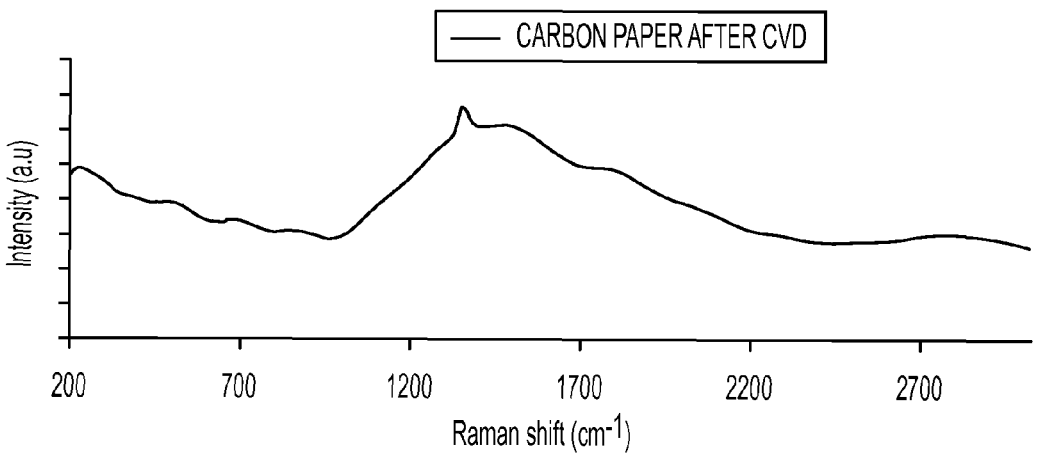
FIG. 2B is a Raman spectra for boron nitride nanotubes grown on the carbon substrate.
Figure 2C:
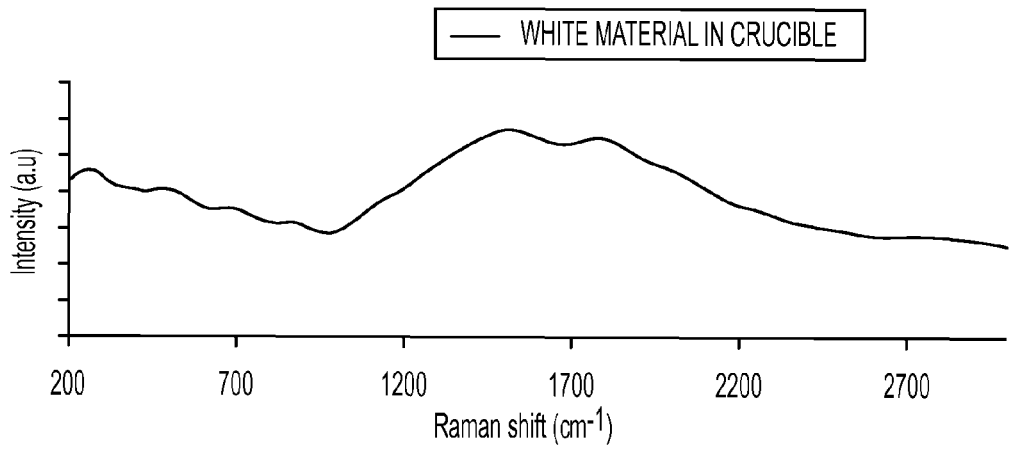
FIG. 2C is a Raman spectra for the residual white material collected from the precursor vessel.

In addition to the growth of boron nitride nanotubes on the carbon substrate, a thin film or coating also formed on the carbon fibers. With reference to FIGS. 2A and 2B, Raman spectra taken for the carbon papers before and after the growth of the boron nitride nanotubes respectively are provided. As can be seen, large background was formed in the spectrum after the growth, on which peaks of boron nitride nanotubes were identified. The background spectrum of FIG. 2B was identical to that taken for the white solid material left in the crucible that originally contained the mixture of the Part NB powder as shown in FIG. 2C. No boron nitride nanotubes could be found from the Raman spectra of the white material. Based on the Raman spectra and additional x-ray diffraction (XRD) analyses, it is concluded that the residual white material in the crucible as well as the thin film/coating on the carbon substrate was made of amorphous boron nitride.

Without wishing to be bound to theory, it is believed the boron nitride nanotubes are formed in accordance with a manner similar to that using boron powder and ammonia gas as the sources of boron and nitrogen. Decomposition of the complex formed from urea and boric acid in the presence of Fe—Mg oxide in an environment of nitrogen gas might release $B_2O_2$ and ammonia. The release is believed to be a slow process and only take place at sufficiently high temperatures similar to those necessary for growth of the boron nitride nanotubes. Otherwise, the complex could be consumed before reaching the growth temperature due to the slow heating up process employed.

Figure 1B:
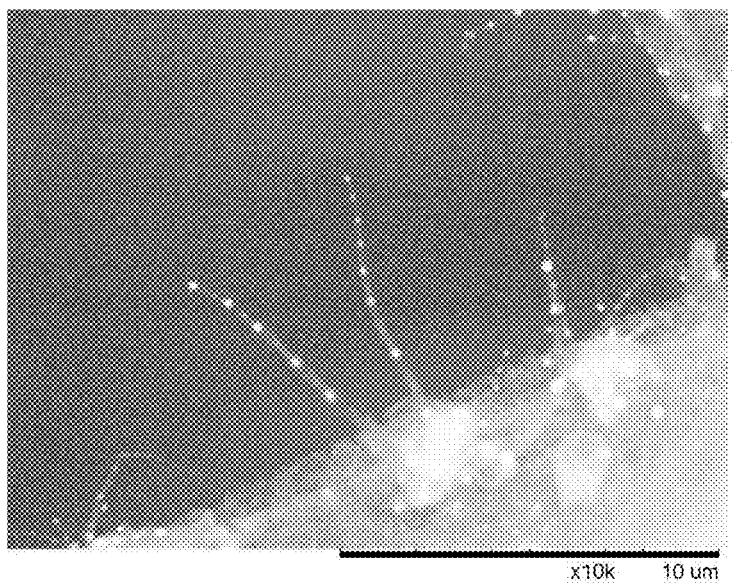
FIG. 1B is a scanning electron microscope image of boron nitride nanotubes grown on the carbon substrate.

In general, similar to carbon nanotubes, growth of boron nitride nanotubes grown by chemical vapor deposition may be classified as three models, base growth, tip growth and base-tip growth. Since multiple catalyst particles were encapsulated in the boron nitride nanotubes, it is considered that the boron nitride nanotubes shown in FIGS. 1A and 1B were grown by base growth. The boron nitride nanotubes were grown with open tips, which offered a possibility for the catalytic particles floating in the gas phase to land and become encapsulated into the tubes. It is not clear whether the encapsulated catalytic particles contributed to further growth of the boron nitride nanotubes. It is believed that the reacting gaseous species were able to reach the catalytic particles encapsulated into the boron nitride nanotubes through the inner channel of the boron nitride nanotubes. Specifically, the reacting gaseous species enter from the tip opening and diffuse down to reach the encapsulated catalyst particles. When the growth ceases, the tips still have opening for landing and capturing catalyst particles floating in the gas phase. Eventually a catalyst particle is captured and, since there is no more growth, other particles in the gas phase might collide with the one already captured and merge to make the particles located at the tips of the boron nitride nanotube bigger than the tube tip diameter.

The Fe—Mg oxide from the Part B powder (the second vapor deposition precursor) is the source of floating iron catalyst. The Fe—Mg oxide is reduced to give Mg and Fe. Elemental magnesium has boiling point of 1091° C. and it is expected that its release from the NB mixed powder (vapor deposition precursor) assists in bringing Fe particles into a gas phase, creating the condition for landing Fe on open tips of the growing boron nitride nanotubes and their subsequent encapsulation into the boron nitride nanotubes.

The diameter of the boron nitride nanotube reduces along the length of the boron nitride nanotube. Without wishing to be bound by theory, the reduction in nanotube diameter is believed to occur because, during growth the catalyst particles or droplets at the base of the boron nitride nanotubes and those catalyst particles encapsulated along the length of the boron nitride nanotubes might undergo reshaping. In addition, concentration of the active species in the gas stream may be reducing over time as the boron nitride nanotubes are forming and lengthening.

The mechanism of formation for the regularly reduced separation distance between the encapsulated catalyst particles from the boron nitride nanotube tube bases to tips remains unclear.

Using these techniques, boron nitride nanotubes may be grown on a carbon substrate such as carbon fiber paper by thermal chemical vapor deposition using boric acid and urea as the sources of boron and nitrogen and Fe/Mg as the catalyst. The formed boron nitride nanotubes comprise distinct encapsulated Fe particles spread along the length of the boron nitride nanotubes in an arrangement of regular separation reduction along tube length in the direction of growth. The diameter of the boron nitride nanotubes, as well as the diameter of the encapsulated particles (except the encapsulated particle at the tube tips), also show a reduction in tube growth direction, giving the boron nitride nanotubes a long-horned shape. In addition to the grown of the boron nitride nanotubes deposition of an amorphous boron nitride coating also takes place on the carbon fibers.

Embodiments of the invention also include methods of growth of silicon nanowires on engineering fibers such as carbon fiber at atmospheric pressure by chemical vapor deposition. The management for the growth at atmospheric pressure allows reduced manufacturing cost and easier processing for larger scale synthesis of the nano-micro hybrid materials compared to any processing using low pressure.

A low pressure environment ranging from a few Torrs to a few hundred Torrs and well below standard atmospheric pressure of 760 Torr is conventionally utilized for growth of silicon nanowires by a vapor-liquid-solid (VLS) technique. The use of low pressure requires employment of a vacuum pump and careful maintenance of the balance between reacting gases flowing in and product gases withdrawing from the reacting chamber. More importantly, the use of low pressure limits the amount of silicon source gases existing in the reaction chamber as well as the flow rate of feeding the gases, restricting growth in large scale.

Growth of carbon nanotubes, and certain inorganic oxide nanowires/nanofibers, such as those of zinc oxide, on engineering fibers, such as carbon fiber, has been reported to have potential applications in making composites. However, the growth of silicon nanowires on engineering fibers for application in composites has not been widely explored.

While silicon has been the foundation of the semiconductor industry, silicon nanowires/nanofibers (SiNWs) have attracted significant academic and industrial interests due to their advantageous properties.

Silicon nanowires generally can be fabricated using various techniques, including vapor-liquid-solid (VLS), solid-liquid-solid (SLS), vapor-solid-solid, and solution-liquid-solid techniques. Among the various techniques VLS has a history about 50 years and has been popularly utilized.

Synthesis of silicon nanowires by vapor-liquid-solid (VLS) techniques generally includes at least a gaseous silicon source and a catalyst. Growth conditions, such as temperature, pressure, and gas flow need to be appropriately managed to form the silicon nanowires. Si-bearing gases are introduced to flow over a catalyst which has been deposited on a carbon substrate. The Si-bearing gases are heated above the Si/catalyst eutectic melting temperature causing the Si-bearing molecules to decompose by pyrolysis. The released Si atoms as a result of the decomposition of the Si-bearing molecules absorb on the catalyst which leads to formation of eutectic melt dots. A continuous supply of Si atoms drives the alloy composition to evolve towards saturation, resulting in Si precipitation. A balance between incorporating Si atoms into the liquid alloy and precipitation is needed for efficient growth of silicon nanowires. As a consequence, the synthesis conditions generally have to be well controlled.

In accordance with embodiments of the present disclosure, fast growth of silicon nanowires at temperatures of 550° C. or lower and at atmospheric pressure allows for the possibility of large scale growth of silicon nanowires using the methods disclosed herein. Specifically, operation at atmospheric pressure and at temperatures of 550° C. or lower allows for a relatively large flow rate of $SiH_4$ as the Si source when compared to traditional methods. The increased flow rate of $SiH_4$ as the Si source contributes to a more rapid growth of the silicon nanowires.

A vacuum environment with a pressure ranging from a few Torrs to few hundred Torrs is conventionally utilized for growth of silicon nanowires by VLS. It has only recently been reported that SiNWs could be grown on a Si substrate by chemical vapor deposition using a gold catalyst at atmospheric pressure, but at a furnace temperature as high as 1100° C. using a low flow rate and concentration of $SiH_4$ as the Si source. While VLS is generally considered to have a low temperature growth capability, the growth of silicon nanowires at relatively low temperatures and simultaneously at atmospheric pressure using gaseous silane has not been previously disclosed. A liquid organosilane precursor, monophenylsilane, was recently utilized to grow Si nanowires by liquid injection chemical vapor deposition at atmospheric pressure. However, gold nanocrystals had to be injected together with the precursor into the reactor before being evaporated for synthesis. Only the gold catalyst deposited on the silicon substrate located in the chamber was used to grow silicon nanowires on the substrate. This results in an issue of extremely low efficiency of gold consumption.

In accordance with embodiments of this disclosure, carbon substrates are instead preloaded with gold catalyst by simple immersion in a solution. As a result, high yield amorphous Si coated crystalline silicone nanowires can be efficiently gown on carbon fibers at temperatures at or below 550° C., under atmospheric pressure, and with significantly higher flow rate of $SiH_4$, compared to previous methods. This results in expeditious silicon nanowire growth.

In embodiments, a method of growing silicon nanowires is provided. The method includes applying a catalyst solution which contains chloroauric acid ($HAuCl_4.3H_2O$) to a carbon substrate comprising carbon fibers. In a preferred embodiment the chloroauric acid is 0.004 M. Then the carbon substrate is introduced into a tube furnace. The tube furnace is heated to a temperature above the decomposition temperature of silane in the presence of a silicon source which contains $SiH_4$. For example, the tube furnace is heated to 450 to 550° C., 475 to 550° C., 500 to 550° C., or 525 to 550° C. In a further embodiment, the tube furnace is heated to a temperature of 550° C. or less in the presence of the silicon source which contains $SiH_4$. The heating in the tube furnace is undertaken at atmospheric pressure. The heating of the tube furnace and carbon substrate in the presence of a silicon source facilitates growth of the nanowires on the carbon substrate.

In embodiments, the method also includes heating the carbon substrate in air at 280 to 320° C. for about 3 minutes before applying the catalyst solution. In a preferred embodiment the carbon substrate is heated in air at approximately 300° C. for 3 minutes.

In embodiments, the catalyst solution also includes ethanol. When applying the catalyst solution to the carbon substrate, the carbon substrate is immersed into the catalyst solution followed by evaporation of the ethanol.

In embodiments, the carbon substrate is placed in a quartz tube which is placed into the tube furnace.

In embodiments, prior to heating the tube furnace, the quartz tube with the carbon substrate disposed therein is flashed with argon gas to expel residual air. Then the tube furnace is heated to 450 to 550° C. under a flow of 600 to 1,000 ml/minute of argon. In a preferred embodiment argon is provided at a flow of 800 ml/minute during tube furnace heating. Further, when the temperature of the tube furnace reaches 450 to 550° C., hydrogen at 45 to 55 ml/minute and $SiH_4$ at 90 to 110 ml/minute are introduced in conjunction with the argon at 600 to 1,000 ml/minute. In a preferred embodiment, when the temperature of the tube furnace reaches 450 to 550° C., hydrogen at 50 ml/minute and $SiH_4$ at 100 ml/minute are introduced in conjunction with the argon at 800 ml/minute.

Amorphous Si-coated crystalline silicon nanowires have been synthesized and studied for various potential applications. For example, core-shell silicon nanowires are particularly interesting for energy storage and conversion devices and electronic and optoelectronic devices. The capability of growing the core-shell silicon nanowires under atmospheric pressure, at lower temperature, and with larger rate of supplying Si bearing gases, would move the fabrication towards an easier and larger scale process. In addition, carbon fibers are widely used for engineering and functional materials, range from composites to microelectrodes of sensors for examples. The growth of silicon nanowires on carbon fibers opens up opportunities for even more applications.

EXAMPLE

Carbon fiber veils with grammage of 10 g/m$^2$ were used as the carbon substrate to grow silicon nanowires. The carbon fibers of the carbon fiber veil have a diameter of about 7 μm. The carbon fiber veils were heated in air at 300° C. for 3 minutes. Subsequently, the carbon fiber veils were immersed in an ethanol solution dissolved with 0.004 M HAuCl$_4$.3H$_2$O. After evaporation of the ethanol solvent, the samples were placed in a 37 mm ID quartz tube, which was then placed in a tube furnace. The quartz tube was flashed with argon to expel air prior to heating the samples under a flow of 800 ml/minute argon. When the temperature of the furnace reached 550° C., hydrogen at 50 ml/minute and SiH$_4$ at 100 ml/minute were introduced into the reactor while continuing flow of argon at 800 ml/minute. After a period of time determined by the level of silicon nanotube growth desired, SiH$_4$ and H$_2$ are turned off, and the samples were cooled down naturally to room temperature under protection of the argon flow.

The resulting silicon nanotube samples may be characterized by a variety of instruments and methods including scanning electron microscopy (SEM), transmission electron microscopy (TEM), x-ray diffraction (XRD) and Raman spectroscopy.

Figure 3:
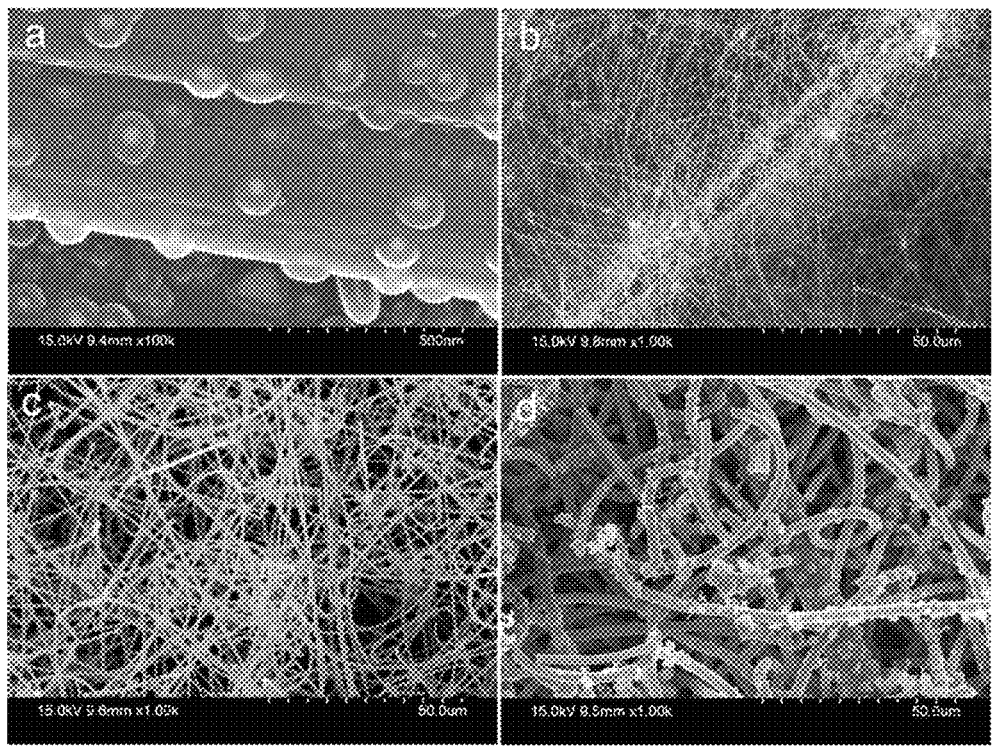
FIG. 3 is a scanning electron microscope image of the silicon nanowires grown on the carbon substrate after a) 5 minutes of exposure to $H_2/SiH_4$, b) after 10 minutes of exposure to $H_2/SiH_4$, c) after 30 minutes of exposure to $H_2/SiH_4$, and d) after 60 minutes of exposure to $H_2/SiH_4$.

FIG. 3 shows scanning electron microscope images of silicon nanowire formation after various periods of exposure in the growth chamber since the introduction of H$_2$/SiH$_4$ at 550° C. Specifically, a series of scanning electron microscope images of silicon nanowire growth on carbon fibers at 550° C. for a) 5 minutes, b) 10 minutes, c) 30 minutes, and d) 60 minutes are provided. As it can be seen in subsection a of FIG. 3, there was no immediate growth of silicon nanowires after supply of the reacting gases. Instead, 5 minutes after introduction of H$_2$/SiH$_4$ at 550° C. the process is still in an incubation stage, in which gold particles are formed.

As the process and introduction of H$_2$/SiH$_4$ at 550° C. continues the reacting gases (H$_2$/SiH$_4$) are passed over the gold particles formed from the catalyst particles, and Si dissociates from SiH$_4$ and coats the catalyst particles. As more Si dissociates and coats the catalyst particles liquid dots form and reach saturation to start precipitation as growth of silicon nanowires. At 10 min of the exposure to H$_2$/SiH$_4$ at 550° C., significant silicon nanowire formation may be found on the carbon fibers.

The silicon nanowires at 10 min of exposure to H$_2$/SiH$_4$ at 550° C. have diameters of about 70 nm to about 200 nm. Diameter of the silicon nanowires rapidly increases with increasing the growth time. At 30 min of exposure to H$_2$/SiH$_4$ at 550° C., the diameter of the silicon nanowires averaged about 1 μm, and at 60 min the average diameter reached about 3 to about 4 μm. Exact length of the silicon nanowires is difficult to determine because of their entanglement. However, FIG. 3 shows silicon nanowires longer than 50 μm. This is a significant length increase in comparison to growth of silicon nanowires at atmospheric pressure on silicon at 1100° C., which could give only 2 to 5 μm length in 2 hours. The methods of the present disclosure, in spite of being carried out at the substantially lower temperature of 550° C. or less, was considerably more efficient.

Figure 4:
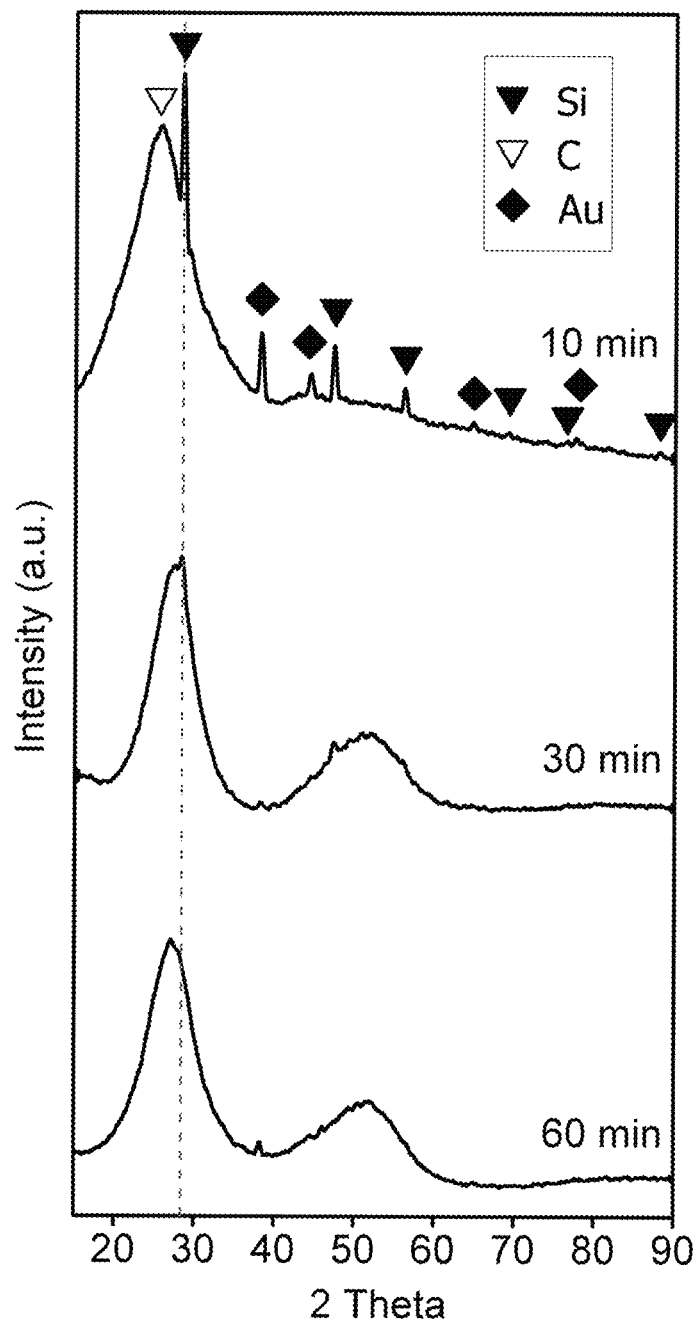
FIG. 4 is XRD patterns of the silicone nanowires grown on the carbon substrate after 10, 30, and 60 minutes of exposure to $H_2/SiH_4$.

Referring to FIG. 4, X-ray diffraction (XRD) patterns of the carbon fibers with silicon nanowires grown thereon are shown. For 10 min growth and exposure to H$_2$/SiH$_4$ at 550° C., major peaks of Si are identifiable at 2θ equal to 28.4°, 47.4° and 56.2°, corresponding to Si (111), Si (220) and Si (311), respectively. Small peaks from Si also exist above the background at 69.1° for Si (400), 76.4° for Si (331) and 88.0° for Si (422). This indicates that crystalline silicon nanowires are present and have grown upon the carbon substrate. The peak at identifiable at 25.6° is contributed by the carbon fibers C (002), and those at 38.2°, 44.4° and 64.5° are from the catalyst Au (111), Au (200), and Au (220). Extending the growth time to 30 minutes of exposure to H$_2$/SiH$_4$ at 550° C., the peak density from Si (111) is significantly reduced relative to C (002), making the Si (111) peak being almost entirely obscured by that of C (002), while the rest of the Si peaks nearly disappear. At a growth time of 60 minutes of exposure to H$_2$/SiH$_4$ at 550° C., only a shoulder at 28.4° can be assigned to Si (111). Therefore, the rapid increase in diameter of the silicon nanowires with growth time is believed to be the consequence of amorphous Si deposition on the crystalline silicon nanowires.

Figure 5:
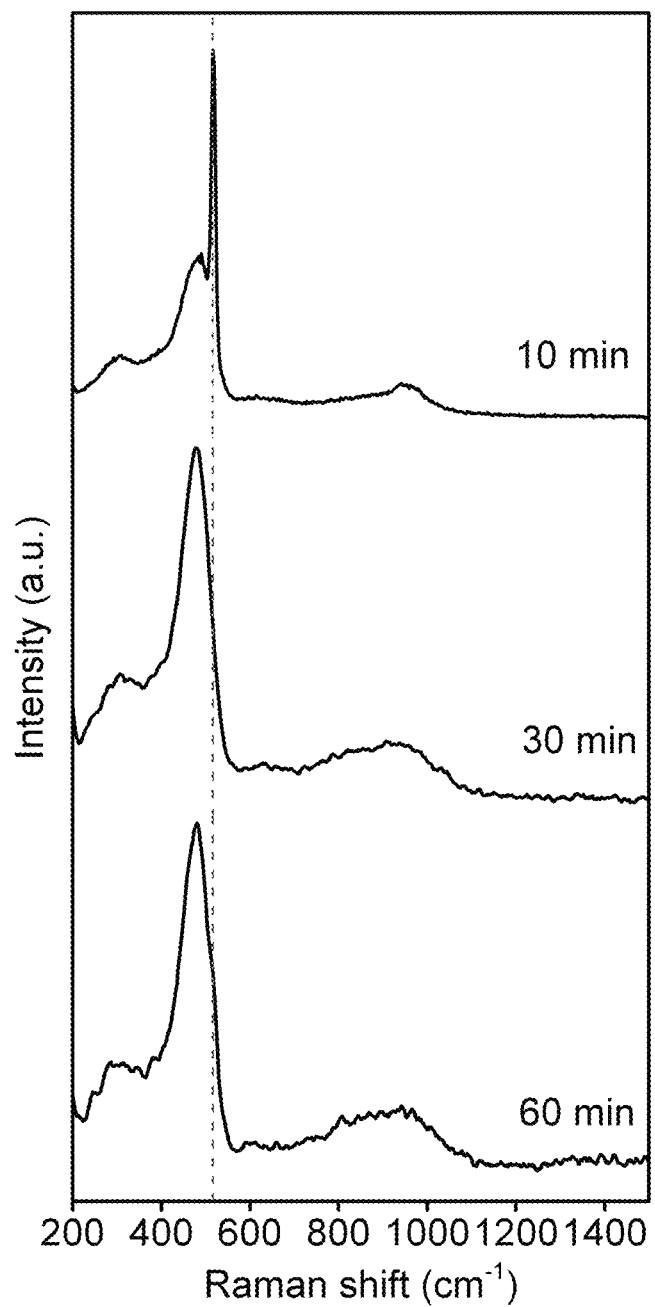
FIG. 5 is Raman spectra of the silicone nanowires grown on the carbon substrate after 10, 30, and 60 minutes of exposure to $H_2/SiH_4$.

Examination of the samples by Raman spectra is in agreement with the XRD study. The Raman spectra of the samples grown with 10, 30 and 60 minutes of exposure to H$_2$/SiH$_4$ at 550° C. are shown in FIG. 5. A sharper peak at 516 cm$^{-1}$ in the spectrum of the sample grown for 10 minutes is attributable to the crystalline Si cores. It is known that standard crystalline Si has a peak at 522 cm$^{-1}$, which corresponds to the first-order optical phonon mode. Comparing with the standard peak, there is a down shift of about 6 cm$^{-1}$, which is a phenomenon generally observed for crystalline Si nanowires. In addition, there are two broad peaks around 945 and 300 cm$^{-1}$, which may be attributed to the second-order optical phonon mode and the second-order transverse acoustic phonon mode. Another broad peak around 470 cm$^{-1}$ belongs to amorphous Si which was also seen in the XRD spectrum, indicating that deposition of amorphous Si has already begun at the growth time of 10 min. While the broad peak at 470 cm$^{-1}$ remains, the peak at 516 cm$^{-1}$ disappears or only a shoulder at 516 cm$^{-1}$ exists for samples grown with 30 and 60 minutes of exposure to H$_2$/SiH$_4$ at 550° C., demonstrating that the crystalline Si nanowires are coated with thicker amorphous Si when fabricated using the extended growth times.

Direct observation of the silicon nanowires was also carried out using transmission electron microscopy (TEM). For the silicon nanowires grown for 10 minutes, a core-sell structure can be seen for some wires. Selected-area electron diffraction (SAED) reveals clear lattice, illustrating that the silicon nanowires have a cubic crystalline core.

Based on the above examination, it is considered that the crystalline cores were grown from the catalyst as clarified in conventional VLS growth mechanism in addition to simultaneous amorphous Si deposition by direct dissociation of SiH$_4$ on the surface of the silicon nanowires. The amorphous Si deposition is believed present due to the employment of atmospheric pressure and the increased flow and/or concentration of SiH$_4$. The rapid increase of diameter of the silicon nanowires as growth time increases is believed to be the consequence of thickness increase of the amorphous Si shell, since diameter of the crystalline cores is directly determined by size of the catalyst particles. The fact that long silicon nanowires were obtained for a time as short as 10 minutes of exposure to H$_2$/SiH$_4$ at 550° C. indicates rapid growth of the crystalline core at the earlier stage of growth. The rapid growth is believed to be due to high activity of the catalyst on the carbon fibers and the use of atmospheric pressure in combination with the increased flow and/or concentration of SiH$_4$, which may feed the catalyst with Si atoms in a speed matching the rapid growth of the crystalline cores. Subsequently, the catalyst activity may drop and ultimately be poisoned, resulting in continuous increase in diameter but no more increase in length, because the dissociation of SiH$_4$ leading to deposition of amorphous Si on the wires is no longer determined by the Au catalyst.

Using these techniques amorphous Si coated crystalline silicon nanowires may be grown on carbon microfibers at atmospheric pressure and temperature of 550° C. using SiH$_4$ as the Si source. The crystalline cores are grown from the gold catalyst by a VLS mechanism, while, due to the employment of atmospheric pressure, dissociation of the silane takes place at surface of the silicon nanowires, leading to formation of the amorphous shell and increased diameter with synthesis time. The method of silicon nanowire formation provided in this disclosure provide the combination of vacuum exemption, simple catalyst preparation by solution immersion, one step growth, and efficient formation of the core-shell silicon nanowires.

Having described the invention in detail and by reference to preferred embodiments thereof, it will be apparent that modifications and variations are possible without departing from the scope of the invention.

What is claimed is:

1. A method of growing boron nitride nanotubes comprising:
    applying a catalyst solution to a carbon substrate comprising carbon fibers, the catalyst solution comprising iron nitrate and magnesium nitrate;
    providing a precursor mixture into a precursor vessel, the precursor mixture comprising a mixture of a first vapor deposition precursor and a second vapor deposition precursor, wherein the first vapor deposition precursor comprises boric acid and urea and the second vapor deposition precursor comprises iron nitrate, magnesium nitrate, and D-sorbitol;
    introducing the precursor mixture and the carbon substrate into a furnace; and
    heating the furnace to vaporize the precursor mixture in the presence of a flowing gas to facilitate growth of the boron nitride nanotubes on the carbon substrate.

2. The method of claim 1, wherein applying the catalyst solution comprises immersion of the carbon substrate into the catalyst solution followed by air drying at ambient temperature.

3. The method of claim 2, wherein the catalyst solution further comprises nitric acid and anhydrous ethanol.

4. The method of claim 3, wherein the catalyst solution comprises 5 to 7 grams iron nitrate, 4 to 6 grams magnesium nitrate, and about 1 ml 70% nitric acid for each 100 ml anhydrous ethanol.

5. The method of claim 1, wherein the method further comprises preparing the first deposition precursor by:
    mixing 0.15 to 0.25 grams boric acid and 1.5 to 2.5 grams urea per 1 ml of distilled water,
    heating the mixture of 0.15 to 0.25 grams boric acid and 1.5 to 2.5 grams urea per 1 ml of distilled water to about 120° C. for about 1 hour to form a dry first vapor deposition precursor,
    cooling the dry first vapor deposition precursor to room temperature, and grinding the cooled dry first vapor deposition precursor into a fine powder.

6. The method of claim 1, wherein the method further comprises preparing the second vapor deposition precursor by:
    dissolving iron nitrate, magnesium nitrate, and D-sorbitol at a weight ratio of about 6:5:1 in sufficient water for dissolution,
    heating the mixture of iron nitrate, magnesium nitrate, and D-sorbitol to evaporate the water and form a dry second vapor deposition precursor,
    heating the dry second vapor deposition precursor in air at about 550° C. for 15 minutes,
    cooling the heated dry second vapor deposition precursor to room temperature, and
    grinding the cooled dry second vapor deposition precursor into a fine powder.

7. The method of claim 1, wherein the ratio of the first vapor deposition precursor to the second deposition precursor in the mixture is 40:1 to 50:1.

8. The method of claim 1, wherein the furnace is heated to about 1300° C. at a rate of 4° C./minute.

9. The method of claim 1, wherein the flowing gas is N$_2$ provided to the furnace at a flow of 15 to 25 ml/minute.

10. The method of claim 1, wherein the furnace is heated to 1300° C. and held at about 1300° C. for about 30 minutes.

11. The method of claim 1, wherein the method further comprises cleaning the carbon substrate with acetone prior to applying the catalyst solution.

* * * * *